United States Patent
Morvan et al.

(10) Patent No.: US 9,612,320 B2
(45) Date of Patent: Apr. 4, 2017

(54) METHOD OF ESTIMATING EQUIVALENT RADAR CROSS SECTION ON THE BASIS OF NEAR-FIELD MEASUREMENTS

(75) Inventors: Sylvain Morvan, Saint Medard en Jalles (FR); Olivier Vacus, Cestas (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 621 days.

(21) Appl. No.: 14/127,167

(22) PCT Filed: Jun. 13, 2012

(86) PCT No.: PCT/EP2012/061192
§ 371 (c)(1),
(2), (4) Date: Dec. 17, 2013

(87) PCT Pub. No.: WO2012/171953
PCT Pub. Date: Dec. 20, 2012

(65) Prior Publication Data
US 2014/0172389 A1 Jun. 19, 2014

(30) Foreign Application Priority Data
Jun. 17, 2011 (FR) .................................... 11 55338

(51) Int. Cl.
*G06F 17/50* (2006.01)
*G01S 13/00* (2006.01)
*G01S 7/41* (2006.01)

(52) U.S. Cl.
CPC .............. *G01S 13/006* (2013.01); *G01S 7/41* (2013.01); *G06F 17/5009* (2013.01)

(58) Field of Classification Search
CPC ........ G01S 13/4454; G01S 7/412; G01S 7/41; G01S 7/292; G01S 7/4052; G01S 13/14454; G06F 17/5095; G06F 17/5018
See application file for complete search history.

(56) References Cited

U.S. PATENT DOCUMENTS

| 7,424,408 B1 * | 9/2008 | Crabtree | ............... G01S 7/4052 434/38 |
| 7,667,638 B1 * | 2/2010 | Karam | ..................... G01S 7/292 342/149 |

(Continued)

FOREIGN PATENT DOCUMENTS

FR 2 914 750 A1 10/2008

OTHER PUBLICATIONS

International Search Report in International Application No. PCT/EP2012/061192, mailed on Aug. 7, 2012.

(Continued)

*Primary Examiner* — Kandasamy Thangavelu
(74) *Attorney, Agent, or Firm* — Nixon Peabody, LLP; Khaled Shami (57) ABSTRACT

A method for estimating the equivalent radar cross section (RCS) of an object using near-field measurements. The method using a diffraction model of the object in far field and a diffraction model in near field. These models make it possible to determine respectively bases adapted to said object in far field and in near field. The measurement vector is first of all projected onto the base adapted in near field and the components obtained are transformed into components on the base in far field. The vector obtained is then returned into the analysis base of the RCS in order to provide a reconstructed vector. The components of the reconstructed vector are next used for calculating the RCS.

12 Claims, 4 Drawing Sheets

(56) References Cited

U.S. PATENT DOCUMENTS

| | | | | |
|---|---|---|---|---|
| 8,924,186 B1* | 12/2014 | Zhao | ............... | G06F 17/5095 |
| | | | | 703/13 |
| RE45,999 E * | 5/2016 | Weber | | |
| 2002/0198670 A1* | 12/2002 | Christiansen | ....... | G06F 17/5018 |
| | | | | 702/65 |
| 2003/0158715 A1* | 8/2003 | Ottusch | ............... | G06F 17/5095 |
| | | | | 703/2 |
| 2004/0246167 A1* | 12/2004 | Kumon | ............... | G01S 7/41 |
| | | | | 342/70 |
| 2009/0040098 A1* | 2/2009 | Lee | ............... | G01S 7/412 |
| | | | | 342/175 |
| 2010/0109941 A1* | 5/2010 | Vacus | ............... | G01S 7/41 |
| | | | | 342/179 |
| 2010/0214156 A1* | 8/2010 | Karam | ............... | G01S 13/4454 |
| | | | | 342/149 |

OTHER PUBLICATIONS

Lahaie, I.J. et al., "Far Field Radar Cross-Section (RCS) Predictions From Planar Near Field Measurements", Proceedings of the Antennas and Propagation Society International Symposium (APSIS), IEEE, pp. 1542-1545, vol. 3, Jun. 18-25, 1992.

Lahaie, I.J., "Overview of and Image-Based Technique for Predicting Far-Field Radar Cross Section from Near-Field Measurements," IEEE Antennas and Propagation Magazine, vol. 45, No. 6, pp. 159-169, Dec. 2003.

Marie, a.C. et al., "A Near-Field Bistatic Radar Cross Section Calibration Method", IEEE Antennas and Propagation Society International Symposium, pp. 4613-4616, Jun. 9-15, 2007.

Ruck, G.T. et al., "Radar Cross Section Handbook", vol. 1, pp. 7-27, 1970.

* cited by examiner

METHOD OF ESTIMATING EQUIVALENT RADAR CROSS SECTION ON THE BASIS OF NEAR-FIELD MEASUREMENTS

CROSS REFERENCE TO RELATED APPLICATIONS

This application is the national stage of International Application No. PCT/EP2012/061192, filed Jun. 13, 2012, entitled, "Method Of Estimating Equivalent Radar Cross Section On The Basis Of Near-Field Measurements," which claims the benefit of priority of French Patent Application No. 11 55338, filed Jun. 17, 2011, the contents of which are incorporated herein by reference in its entirety.

TECHNICAL FIELD

The present invention concerns the field of radar signature and more particularly the determination of an equivalent radar cross section.

PRIOR ART

The equivalent radar cross section or RCS is a fundamental quantity that is characteristic of a target. It is used both in the military field and in the civil domain (for example for air traffic control) for the purpose of discriminating an object, typically an aircraft.

The RCS of a radar target is defined conventionally from a power comparison of the wave emitted in the direction of the target and the power of the wave received by the radar. In far field and approximating the waves to plane waves, the radar equation is in fact written:

$$P_r = P_e G_e \frac{1}{4\pi d^2} \sigma \frac{1}{4\pi d^2} G_r \frac{\lambda^2}{4\pi} \quad (1)$$

where $P_e$ and $P_r$ are respectively the powers of the waves emitted and received by the radar, $G_e$ and $G_r$ the antenna gains on emission and reception, d the distance between the radar and the target, $\lambda$ the wavelength used by the radar. The coefficient $\sigma$ is homogeneous at a surface and depends only on the target in question, this is the RCS of the target.

A more detailed description of the RCS will be found in particular in the work by G. T. Ruck et al, entitled "Radar Cross-Section Handbook" from Peninsula Publishing.

In expression (1) it was assumed that the radar used to illuminate the target was the same as that used for receiving the diffracted wave, and then monostatic RCS is spoken of. As a general rule, the monostatic RCS depends on the direction of the incident wave, the frequency f of the radar and the respective polarisations $\pi_e$ and $\pi_r$ with which the incident wave is emitted and the received wave is analysed. It is denoted SER (f, $\phi$, $\theta$, $\pi_e$, $\pi_r$), where ($\phi$, $\theta$) are the relative-bearing and roll angles of the radar in a reference frame related to the target. Each of the polarisations $\pi_e$ and $\pi_r$ may be horizontal or vertical, that is to say $\pi_e$=H or V; $\pi_r$=H or V.

In a similar manner, if the radar system is bistatic, that is to say if the radar used to analyse the diffracted wave is distinct from that which serves to eliminate the target, bistatic RCS is spoken of. This bistatic RCS then no longer depends only on the direction of the incident wave but also on the direction of the diffracted wave. It is denoted SER (f, $\phi_e$, $\theta_e$, $\phi_r$, $\theta_r$, $\pi_e$, $\pi_r$) where ($\theta_e$, $\phi_e$), and respectively ($\theta_r$, $\phi_r$), are the relative-bearing and roll angles of the incident wave, and respectively of the diffracted wave.

The RCS of an object may be measured or estimated by simulation.

These two methods do however have many limitations.

The RCS is conventionally measured in an anechoic chamber, by means of a single antenna, or by means of two separate antennas slightly offset angularly with respect to each other. According to circumstances the monostatic RCS or quasi-monostatic RCS values are obtained, for a bearing angle or a plurality of such angles. The measurements can in practice be made only at a few bearing angles in an equatorial plane so that only a fairly summary bidimentional representation of target is available. Obtaining a three-dimensional RCS by measurement is very rare and very often impossible.

Furthermore, the measurements are often affected by noises from various sources (stray echoes, instrumentation noise, etc), this problem being aggravated in the low-frequency regime (wavelength greater than or very much greater than the characteristic dimensions of the object), where the efficiency of the absorbents is less.

Estimating the RCS by simulation may alternatively be carried out by the so-called bright points method. According to this method, the target is broken down into a set of independent elementary contributors (or bright points), each contributor being allocated a weighting coefficient. In other words the diffracted wave is then considered to be the sum of a plurality of spherical waves, each spherical wave being emitted by a bright point. The RCS of the target can then be expressed as:

$$\sigma = \left| \sum_{n=1}^{N} a_n e^{j\vec{k}\cdot\vec{u}_n} \right| \quad (2)$$

where $a_n$, n=1, . . . , N are the complex weighting coefficients of the various contributors, $\vec{u}_n$ are the vectors giving their respective positions and $\vec{k}$ is the wave vector of the diffracted wave.

The bright points method does however prove to be excessively difficult to implement for complex target forms and in any event is not applicable in the low-frequency regime.

One method for determining the RCS from a diffraction model of the target and from measurements in a plurality of directions was disclosed in the patent EP-B-2132586, filed in the name of the present applicant.

In substance, the diffraction model is represented by a matrix of ratios of complex amplitudes of a wave diffracted by the target and incident wave, each ratio relating to a pair of directions of the incident wave and of diffracted wave observations. This matrix is then the subject of a modal decomposition, only the most significant modal vectors being selected. The measurement vector is then projected onto these selected modal vectors and a reconstructed vector is derived therefrom, the components of which represent complex amplitude ratios of incident wave and diffracted wave for the pairs of directions and polarisations of the model. The RCS is then calculated from the components of the reconstructed vector.

This hybrid method, in that it relies both on a diffraction model and on measurements, gives satisfactory results provided that the waves used for the measurement can be assimilated to plane waves, that is to say when the measurement is carried out in far field. This approximation is generally valid for high frequencies (short wavelengths compared with the characteristic dimensions of the target), when the emission/reception antennas are situated far from the target. However, in low-frequency regime and/or when the antennas in question are close to the target, this approximation is no longer valid and the value of the RCS may be erroneous The aim of the invention is consequently to propose a method for estimating RCS that does have the aforementioned drawbacks, namely a method that enables a correct determination of the RCS when the near-field hypothesis is not satisfied.

DISCLOSURE OF THE INVENTION

The present invention is defined as a method for estimating the equivalent radar cross section on the basis of a first near-field diffraction model of said object and a second near-field diffraction model of said object, the first and second models being able to be respectively represented by a first matrix ($A_b$) and a second matrix ($A'_b$) of complex diffracted wave and incident wave amplitude ratios, for a plurality ($4N^2$) of pairs of respective directions and polarisations of the incident wave and observation of the diffracted wave, in which:

- a modal decomposition of said first and second matrices is carried out and the most significant modal vectors (V, V') of the first and second matrices thus decomposed are selected in order to obtain a first base and a second base of modal vectors;
- a correspondence is established between modal vectors of the first base and modal vectors of the second base;
- an operator (F) for passing from the second modal vectors ($\lambda'^s$) associated with the modal vectors of the second base to the first modal values ($\lambda^s$) associated with the modal vectors corresponding to the first base is determined;
- a plurality ($N^\mu$) of measurements of complex diffracted wave and incident wave amplitude ratios in near field are made for a plurality of pairs of directions and at least one pair of respective polarisations of the incident wave and observation of the diffracted wave;
- the vector ($a'^\mu$), formed by the ratios thus measured, is projected onto said modal vectors of the second base, in order to obtain second modal components ($\lambda'^\mu$) on this base;
- first modal components ($\lambda^\mu$) on the first modal base are obtained by applying said operator to the second modal components;
- from the first modal components and the modal vectors of the first base a reconstructed vector (ã) is generated, the components of which represent the complex incident wave and diffracted wave amplitude ratios for said plurality of pairs of directions and polarisations;
- the equivalent radar cross section is determined from at least one component of the reconstructed vector.

According to a first variant said modal decomposition is a diagonalisation and:
- the modal vectors of the first base and the first modal values are respectively the eigenvectors and the eigenvalues of the first matrix;
- the modal vectors of the second base and the second modal values are respectively the eigenvectors and the eigenvalues of the second matrix.

According to a third variant, said modal decomposition is a decomposition into singular values, and:
- the modal vectors of the first base and the first modal values are respectively the singular vectors and singular values of the first matrix;
- the modal vectors of the second base and the second modal values are respectively the singular vectors and the singular values of the second matrix.

Said correspondence may be established by seeking, for each modal vector of the second base, the modal vector of the first base that is closest thereto.

Alternatively, said correspondence may be established step by step between the modal vectors of the first base and the modal vectors of the second base by means of a plurality of successive operations, each association relating to an intermediate modal vector base.

Said operator may be defined by F=Diag ($\lambda_s/\lambda'_s$) where $\lambda_s$, $\lambda'_s$ are respectively the first and second modal values and Diag(·) is the diagonal matrix of rank s, equal to the number of modal vectors of the first/second base.

Alternatively, said operator is defined by a pseudo-inverse matrix minimising the distance between F ($\lambda'^s$) and $\lambda^s$ for a set of pairs $\lambda'^s_p$, $\lambda^s_p$, p=1, . . . , P, where $\lambda^s_p$ and $\lambda'^s_p$ are first and second modal values obtained by P respective simulations of the first and second diffraction models.

The second modal components are advantageously determined by:

$$\lambda'^\mu = (V'^\mu)^\dagger a'^\mu$$

where $\lambda'^\mu$ represents the vector of the second modal components, $(V'^\mu)^\dagger$ is the pseudo-inverse matrix of $V'^\mu$, $V'^\mu$ is the matrix the columns of which are said modal vectors of the second base and the rows of which correspond to the second plurality of measured ratios.

The reconstructed vector ã can then be generated by ã=$V^s \lambda^\mu$ here $V^s$ is the matrix the columns of which are said modal vectors of the first base and the rows of which correspond to the first plurality of ratios of the first model.

The equivalent radar cross section ($\tilde{\sigma}_{ij}^{\pi_e \pi_r}$) for a pair of incident wave and diffracted wave observation directions and a pair of associated polarisations can then be obtained from the squared modulus ($|\tilde{a}_{ij}^{\pi_e \pi_r}|^2$) of a component of said reconstructed vector.

The pseudo-inverse matrix of $V'^\mu$ can be obtained by $(V'^\mu)^\dagger = (V'^{\mu H} V'^\mu)^{-1} V'^{\mu H}$, the matrix $V'^\mu$ previously being the subject of a matrix reconditioning if the conditioning number of the matrix $V'^{\mu H} V'^\mu$ is greater than a predetermined threshold (cond$_T$).

The invention also concerns a computer program comprising software means adapted to carry out the steps of the estimation method, when it is executed by a computer.

BRIEF DESCRIPTION OF THE DRAWINGS

Other features and advantages of the invention will emerge from a reading of a preferential embodiment of the invention given with reference to the accompanying figures, among which.

DETAILED DISCLOSURE OF PARTICULAR EMBODIMENTS

We will consider in the following a target, the monostatic or bistatic RCS of which is wished to be estimated, whether in high frequency or low frequency, within the meaning defined above.

In general terms, for a given frequency f the description of the bistatic RCS of the target can be expressed in the form of a matrix of size 2N×2N:

$$\Sigma_b = \begin{pmatrix} \sigma_{11}^{HH} & \sigma_{12}^{HH} & \cdots & \sigma_{1N}^{HH} & \sigma_{11}^{HV} & \sigma_{12}^{HV} & \cdots & \sigma_{1N}^{HV} \\ \sigma_{21}^{HH} & \sigma_{22}^{HH} & \cdots & \sigma_{2N}^{HH} & \sigma_{21}^{HV} & \sigma_{22}^{HV} & \cdots & \sigma_{2N}^{HV} \\ \vdots & \vdots & \ddots & \vdots & \vdots & \vdots & \ddots & \vdots \\ \sigma_{N1}^{HH} & \sigma_{N2}^{HH} & \cdots & \sigma_{NN}^{HH} & \sigma_{N1}^{HV} & \sigma_{N2}^{HV} & \cdots & \sigma_{NN}^{HV} \\ \sigma_{11}^{VH} & \sigma_{12}^{VH} & \cdots & \sigma_{1N}^{VH} & \sigma_{11}^{VV} & \sigma_{12}^{VV} & \cdots & \sigma_{1N}^{VV} \\ \sigma_{21}^{VH} & \sigma_{22}^{VH} & \cdots & \sigma_{2N}^{VH} & \sigma_{21}^{VV} & \sigma_{22}^{VV} & \cdots & \sigma_{2N}^{VV} \\ \vdots & \vdots & \ddots & \vdots & \vdots & \vdots & \ddots & \vdots \\ \sigma_{N1}^{VH} & \sigma_{N2}^{VH} & \cdots & \sigma_{NN}^{VH} & \sigma_{N1}^{VV} & \sigma_{N2}^{VV} & \cdots & \sigma_{NN}^{VV} \end{pmatrix} \quad (3)$$

where each element $\sigma_{ij}^{\pi_e \pi_r}$ is the value of the RCS observed for an incident wave of direction $\vec{u}_i^e$ of polarisation $\pi_e$=H or V and for a reception direction $\vec{u}_j^r$ with a polarisation $\pi_r$=H or V. The directions $\vec{u}_i^e$ and $\vec{u}_j^r$, i, j=1, ..., N are advantageously but not necessarily equally distributed in the solid angle $4\pi$. For example, these directions may be equally distributed angularly in bearing and roll. It will be understood that the higher N is, the more precise will be the description of the RCS. N will advantageously be chosen so that the sampling at the bearing angle and the roll angle complies with the Nyquist criterion.

The matrix $\Sigma_b$ is of the positive real value type. The diffraction matrix $A_b$ with complex values is introduced, the elements of which are not power ratios but ratios of complex amplitudes of the received wave and incident wave, in other words $A_b=(a_{ij}^{\pi_e \pi_r})$, j=1, ..., N, $\pi_e$=H or V, $\pi_r$=H or V with $a_{ij}^{\pi_e \pi_r}=\sqrt{\sigma_{ij}^{\pi_e \pi_r}} \exp(i\psi_{ij}^{\pi_e \pi_r})$ to within a multiplication coefficient, where $\psi_{ij}^{\pi_e \pi_r}$ represents the phase shift undergone by the diffracted wave with respect to the incident wave. The element $a_{ij}^{\pi_e \pi_r}$ is also referred to as the backscatter coefficient, relative to the incident wave in the direction i and the polarisation $\pi_e$ and to the diffracted wave observed in the direction j and analysed according to the polarisation $\pi_r$.

As in the aforementioned prior art, the method for estimating the RCS according to the invention starts from a matrix $A_b$ that is as complete as possible, that is to say where the largest possible number of elements $a_{ij}^{\pi_e \pi_r}$ are known, both in terms of emission $\vec{u}_e$ and reception $\vec{u}_r$ directions and in terms of polarisations $\pi_e$, $\pi_r$. This matrix can be obtained with greater or lesser precision and for a greater or lesser number of elements, either by calculation by means of a modelling of the object if its form is not too complex, or by a measurement campaign carried out on a mock-up of the object to reduced scale. The matrix $A_b$ constitutes a diffraction model of the object.

When the surface of the target is perfectly conductive, the matrix $A_b$ can be written as:

$$A_b = WDW^{-1} \quad (4)$$

where $D=\text{diag}(\lambda_1, \ldots, \lambda_{2N})$ is the diagonal matrix with as its elements the eigenvalues $\lambda_1, \ldots, \lambda_{2N}$ of $A_b$ and where W is the base change matrix.

The matrix $A_b$ can be expressed by means of the modal decomposition:

$$A_b = \sum_{k=1}^{2N} \lambda_k V_k \quad (5)$$

with $$V_k = W I_k W^{-1}$$

where $I_k$ is a matrix of size 2N×2N zero throughout with the exception of the $k^{th}$ element of its diagonal equal to 1.

If the surface of the target is not perfectly conductive but simply dielectric, the matrix $A_b$ is no longer diagonalisable. It may however be the subject of a decomposition into singular values:

$$A_b = UDV^H \quad (6)$$

where $D=\text{diag}(\lambda_1, \ldots, \lambda_{2N})$ is the diagonal matrix whose elements are the singular values $\lambda_1, \ldots, \lambda_{2N}$ of $A_b$, U and V are unitary matrices and $V^H$ is the conjugate transpose of V. The matrix $A_b$ can then be written, in a manner similar to (5):

$$A_b = \sum_{k=1}^{2N} \lambda_k V_k \quad (7)$$

with $$V_k = U I_k V^H$$

Hereinafter we shall refer to the eigenvalues or to the singular values under the more general expression of modal values.

In both cases, if the vector $a_b$ of size $4N^2$ is defined as the concatenation of the 2N column vectors of the matrix $A_b$ and, in a similar manner, the vector $v_k$ as the concatenation of the column vectors of the matrix $V_k$, equation (7) is written vectorially:

$$a_b = \sum_{k=1}^{2N} \lambda_k v_k \quad (8)$$

or if respectively $\lambda$ denotes the vector having the modal values as its components and V the matrix of size 2N×2N the columns of which consist of the vectors $v_k$:

$$a_b = V\lambda \quad (9)$$

Each of the vectors $v_k$ corresponds to the excitation of a characteristic current of the target and therefore to the generation of a characteristic wave. Hereinafter, the vectors $v_k$ are also referred to as far-field modal vectors. The most significant modes, that is to say the most energetic modes, are selected.

After selection of the most energetic modes, the expression (8) is reduced to:

$$\tilde{a}_b = \sum_{k \in S} \lambda_k v_k \quad (10)$$

where S is the set of modes selected. In an equivalent manner, this amounts to reducing the dimensionality of λ and V:

$$\tilde{a}_b = V^s \lambda^s \quad (11)$$

where the vector $\lambda^s$ is obtained by eliminating from k the non-selected components and, likewise, the matrix $V^s$ is obtained from V by eliminating the non-selected column vectors. $V^s$ is a matrix of size $4N^2 \times s$ where s=Card(S) is the number of modes selected.

In this way a diffraction model is obtained, simplified but nevertheless relevant, of the object. The modal vectors $v_k$, $k \in S$, that is to say the column vectors of $V^s$, generate a space $E^s$, a subspace of the space $E_{2N}$ spanned by the vectors $v_k$, $k=1, \ldots, 2N$.

It should be noted that the diffraction model is identical to that used in the aforementioned prior art, and that it is a case of a far-field diffraction model, within the meaning defined below.

Unlike the prior art, measurements of backscattered coefficients are effected in near field of the target but by means of an aerial serving as an emission/reception antenna.

Near field means here a field that does not satisfy the far field conditions. It will be recalled that a field is said to be far if the distance $L_b$ from the aerial to the target (also referred to as the base length) is greater than the Rayleigh distance defined by:

$$L_R = \frac{2D^2}{\lambda} \quad (12)$$

where D is the characteristic dimension of the target and λ is the wavelength. In near field, the wave has a spherical character, in other words a non-zero field component in the propagation direction. In general terms a measurement would be said to be made in near field if the distance from the emission antenna and/or reception antenna to the target is less the distance $L_R$ of the target.

In a similar manner to the far-field diffraction model (defined by the base of the modal vectors $v_k$, $k \in S$), a near-field diffraction model is produced. This diffraction model, like the previous one, is necessary to the exploitation of the measurements and will be described below.

A model of the aerial used for the measurements is first of all considered. This model can be obtained by meshing a representation of the aerial and solving the Maxwell equations on the meshed network, in a manner known per se. It is then possible to calculate the field at the target from the complex amplitude of the excitation of the aerial, and then the diffracted field and finally the complex amplitude received, or in other words the parameter $S_{11}$ of the aerial plus target assembly. Far so doing, it is assumed that the base length is the same as in the case of the real measurement. Where applicable, other elements of the environment of the target, such as the walls of the anechoic chamber, the position, etc can also be modelled and taken into account in the aforementioned simulation. Alternatively, the aerial can be modelled in the form of an equivalent set of elementary dipoles, arranged so that the sum of the fields respectively generated by these dipoles is substantially equal to the field generated by the aerial on the target. In other words, the generation by the aerial of a given wave is equivalent to the generation of respective elementary waves by the dipoles in question. Symmetrically, the diffracted wave is represented by a plurality of complex amplitudes of the diffracted wave, as received by the various dipoles. From these complex amplitudes, it is possible then to determine the complex amplitude of the diffracted wave that will be received by the aerial. The same simulation can be achieved in bistatism, that is to say for an emission aerial and a reception aerial, each aerial being broken down into a set of elementary dipoles.

Finally, as before, the near-field diffraction model obtained by simulation can be supplemented by values measured on a reduced model of the target.

In all cases, the near-field diffraction model is represented by a matrix $A'_b = (a'_{ij}{}^{\pi_e \pi_r})$ where the $a'_{ij}{}^{\pi_e \pi_r}$ are complex amplitude ratios of the received wave and the incident wave in near field for the directions i and j, for the polarisations of $\pi_e$ and $\pi_4$. The matrix $A'_b$ is the same size as the matrix $A_b$, that is to say $2N \times 2N$. Hereinafter, the primed symbols relate to the near-field configuration and the non-primed symbols to the far-field configuration. With this convention, the matrix $A'_b$ can be broken down in a manner similar to (7):

$$A'_b = \sum_{k=1}^{2N} \lambda'_k V'_k \quad (13)$$

with $$V'_k = U' I_k V'^H$$

If the vector $a'_b$ of size $4N^2$ is defined as the concatenation of the 2N column vectors of the matrix $A'_b$ and, in a similar manner, the vector $v'_k$ as the concatenation of the column vectors of the matrix $V'_k$, equation (7) is written vectorially:

$$a'_b = \sum_{k=1}^{2N} \lambda'_k v'_k = V' \lambda' \quad (14)$$

in which λ' is a vector the components of which are the modal values $\lambda'_k$, $k=1, \ldots, 2N$, and V' is the matrix of size $2N \times 2N$ the columns of which are formed by the vector $v'_k$. Each of the vectors $v'_k$ corresponds to the excitation of a characteristic current of the target when it is illuminated in the near-field configuration at a distance corresponding to the base length. Hereinafter the vectors $v'_k$ are also referred to as near-field modal vectors.

As with the far-field configuration, the s most energetic modes are selected:

$$\tilde{a}'_b = \sum_{k \in S} \lambda'_k v'_k \quad (15)$$

where s=Card(S). It should be noted that the same number of modes are selected in near field as in far field. This selection amounts to correlatively reducing the dimensionality of λ' and V':

$$\tilde{a}'_b = V'^s \lambda'^s \quad (16)$$

where the vector $\lambda'^s$ is obtained by eliminating from λ' the non-selected components and, likewise the matrix $V'^s$ is obtained from V' by eliminating the non-selected column vectors. $V'^s$ is therefore a matrix of size $4N^2 \times s$.

The modal bases in far field ($v_k$, $k \in S$) and near field ($v'_k$, $k \in S$) being obtained, it is sought to associate with each far-field modal vector a corresponding modal vector in near field. This correspondence may for example be determined by seeking for each modal vector $v_k$, $k \in S$ the modal vector $v'_{f(k)}$ such that the distance $\|v_k - v'_{f(k)}\|$ is minimum: where f is a bijection (that is to say a permutation) on S. According to an advantageous variant, the correspondence is established gradually by varying the base length of the real value (used for the measurement) to a value substantially greater than the Rayleigh distance. A calculation of the modal vectors $v'_k$, $k \in S$ is made at each step and the bijection f is simply the composite of intermediate bijections $f_1 \circ f_2 \circ \ldots f_L$.

This bijection being identified, the permutation f will be ignored in the notations for reasons of simplification. In other words, the index s hereinafter designates corresponding modes in far field and near field.

An operator F transforming the vector $\lambda'^s$ into a vector $\lambda^s$ is next determined, in other words transforming the near-field modal values into far-field modal values.

This operator can be obtained in various ways. According to a first variant, the operator F is simply represented by the diagonal matrix:

$$F = \text{Diag}(\lambda_s / \lambda'_s) \quad (17)$$

Alternatively, if a plurality P of simulations are performed, each simulation supplying a modal vector pair $\lambda'^s_p$ and $\lambda^s_p$, the operator F can be determined as the pseudo-inverse matrix $F^\dagger$ minimising the distance between $F(\lambda'^s)$ and $\lambda^s$ over all the pairs $\lambda'^s_p, \lambda^s_p$, $p = 1, \ldots, P$. Other versions of the operator can be envisaged without departing from the scope of the present invention.

In any event, the near-field measurements are then made on the real target.

The vector of the ratios of the complex amplitudes of the diffracted wave and incident wave is denoted $a'^\mu$. This vector is generally very incomplete with respect to $\tilde{a}'_b$: only some directions and some polarisations will generally have been measured. For example, the elements corresponding to the monostatic configuration may be missing. $N^\mu$ denotes the number of measurements, with $N^\mu \ll 4N^2$ but $N^\mu \geq s$, and $V'^\mu$ the matrix obtained from $V'^s$ by eliminating the rows for which a measurement is not available. $a'^\mu$ is therefore a vector of size $N^\mu$ and $V'^\mu$ a matrix of size $N^\mu \times s$.

According to the principle of the invention, the vector $a'^\mu$ is projected onto the eigenspace $E'^s$ generated by the modal vectors $v'_k$, $k \in S$, which amounts to calculating the vector:

$$\lambda'^\mu = (V'^\mu)^\dagger a^\mu \quad (18)$$

where $(V'^\mu)^\dagger = (V'^{\mu H} V'^\mu)^{-1} V'^{\mu H}$ has denoted the pseudo-inverse matrix of $V'^\mu$ and $V'^{\mu H}$ the conjugate transpose of $V'^\mu$. The pseudo-inverse matrix may be obtained for example by means of a decomposition of $V'^\mu$ into singular values. The difference between the 2N components of $\lambda'^\mu$ and the theoretical modal components is due firstly to the measurement noise in the broad sense (parasitic echoes, couplings, noise at the instrumentation, etc) and secondly to the differences between the model and the real object measured. It will be understood that only the measurement noise projected onto the space $E'^s$ affects this difference. The projection onto $E'^s$ can be considered to be a filtering adapted to the diffraction model of the object, making it possible to increase the signal to noise ratio of the measurements made.

Next the corresponding far-field modal components are determined by means of the operator F, that is to say:

$$\lambda^\mu = F(\lambda'^\mu) \quad (19)$$

If a reconstructed vector $\tilde{a}$, is now defined by:

$$\tilde{a} = V^s \lambda^\mu \quad (20)$$

$\tilde{a}$ is a vector of size $4N^2$ that corresponds to a matrix $\tilde{A} = (\tilde{a}_{ij}^{\pi_e \pi_r})$, $i, j = 1, \ldots, N$ of size $2N \times 2N$ the common vectors of which are respectively the 2N blocks of 2N successive components of $\tilde{a}$. In other words, the matrix $\tilde{A}$ is obtained from $\tilde{a}$, in the same way as $A_b$ is obtained from $a_b$.

Finally, the RCS $\tilde{\Sigma}$ is defined by its components $\tilde{\sigma}_{ij}^{\pi_e \pi_r} = |\tilde{a}_{ij}^{\pi_e \pi_r}|^2$, $i, j = 1, \ldots, 2N$, $\pi_e = H$ or V, $\pi_r = H$ or V.

The method disclosed above may optionally be iterated, the matrix $\tilde{A}$ then serving as a new model $A_b$. Thus the model is corrected along with the iterations in order to make it more in accordance with the object actually measured.

The sequence of operations of filtering, change of phase by means of F and reconstruction, making $a'^\mu$ correspond to $\tilde{a}$, has a multiple advantage:

First of all, it makes it possible to pass from near-field measurements to values of RCS, in accordance with the subject matter of the invention.

It also makes it possible to obtain RCS values) $(\tilde{\sigma}_{ij}^{\pi_e \pi_r})$ for pairs of directions $(\vec{u}_e, \vec{u}_r)$ and/or pairs of polarisations $(\pi_e, \pi_r)$ that are not measured. Thus, from a relatively small number of measurements, by virtue of this extrapolation, an estimation of the complete bistatic RCS $\tilde{\Sigma}$ of the object is obtained. This is due to the fact that the vectors $v_k$, $k \in S$ form a base adapted to the determination of the RCS.

Moreover, even for a pair of directions $(\vec{u}_e, \vec{u}_r)$ and a pair of polarisations $(\pi_e, \pi_r)$ that were the subject of a measurement, the RCS $\tilde{\sigma}_{ij}^{\pi_e \pi_r}$ will be better than that which would have been obtained directly from the measurement. This is due to the noise filtering by projection onto the space $E'^s$, as explained previously.

Finally, it makes it possible to obtain a better estimation of the RCS than that given initially by the diffraction model. This is because the model gives approximately the eigenaxes of the RCS and the measurements make it possible to estimate precisely the modal components on the axes in question.

The precision with which it will be possible to estimate the modal components and consequently the RCS depends to a major extent on the conditioning of the matrix $V'^\mu$ in (18). It will be recalled that the conditioning number of an invertible square matrix $\Omega$ is given by:

$$\text{cond}(\Omega) = \|\Omega^{-1}\| \cdot \|\Omega\| \quad (21)$$

where the Euclidien norm is denoted $\|\cdot\|$.

Poor conditioning of the matrix $V'^\mu$ may be due either to an excessively high number of selected modes s, the vectors $v'_k$, $k \in S$ then being almost linked, or to an insufficient number of measurements $N^\mu$.

It will then be possible to reduce the number s of selected modes, by decimating the column vectors of $V'^\mu$ (and correspondingly of $V^\mu$) by eliminating preferably the most energetic modes, where applicable iteratively, until:

$$\text{cond}(V'^{\mu H} V'^\mu) < \text{cond}_T \quad (22)$$

where $\text{cond}_T$ is a predetermined threshold value.

Alternatively the number of measurements is increased, where necessary iteratively, until the conditioning is satisfactory.

Figure 1:
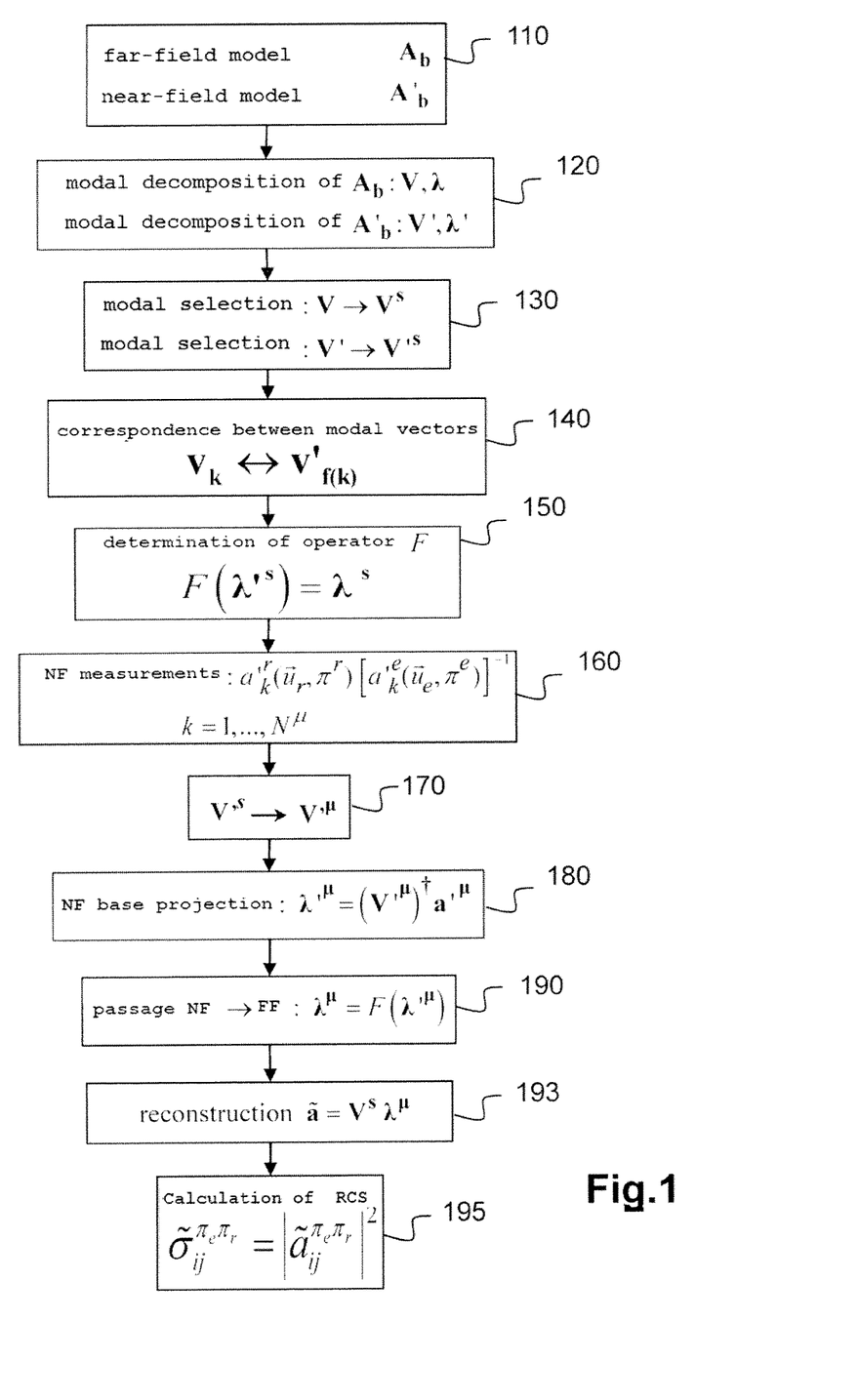
FIG. 1 shows the flow diagram of a method for estimating RCS from near-field measurements, according to one embodiment of the invention.

FIG. 1 illustrates schematically the method for estimating RCS according to one embodiment of the invention.

The method starts at 110 with a far-field diffraction model and a near-field diffraction model of the object the RCS of which it is wished to estimate.

The far-field model is defined by a diffraction matrix $A_b$ for a plurality of pairs of incident waves and diffracted waves as well as a plurality of polarisations. In this model, the incident and diffracted waves are considered to be plane waves.

The near-field model is defined by a diffraction matrix $A'_b$ also obtained for a plurality of pairs of incident waves and diffracted waves as well as a plurality of polarisations. In this model, the incident and/or diffracted waves are considered to be emitted and/or received in near field, that is to say at a distance less than the Rayleigh distance of the object.

At step 120, the modal decomposition of $A_b$ is carried out. The matrix of the eigenvectors V and the vector of the modal values $\lambda$ are obtained. The same procedure is followed for the modal decomposition of $A'_b$. The matrix of the eigenvectors V' and the vector of the modal vectors $\lambda'$ is obtained.

At step 130, the set S of most significant modes is determined and, by deletion of columns, the matrix V is reduced to the matrix $V^s$ in which only the modes of S are kept. The same procedures follow for the matrix V keeping the same number s=Card (S) of the most significant modes, and then the matrix $V'^s$ is obtained. It should be noted that the columns deleted in $V'^s$ are not necessarily the same as those deleted in $V^s$.

At step 140, a match is established between the far-field modal vectors and the near-field modal vectors, either directly or by means of several successive association steps using near-field modal bases for lengths of bases distributed between real base length (used for the measurements) and infinity, advantageously between the real base length and the Rayleigh distance.

At step 150, the operator F for passing from the near-field modal values to the far-field modal values is determined. More precisely, the operator F makes it possible to pass from each modal value, relating to a near-field modal vector, to the modal value relating to the corresponding far-field modal vector, within the meaning of the previous step.

At step 160, $N^\mu$>Card(S) measurements are made of complex incident wave amplitudes $a'^e_k(\vec{u}_e, \pi^e)$ and diffracted wave amplitudes $a'^r_k(\vec{u}_r, \pi^r)$, in near field, in order to obtain the $N^\mu$ complex ratios $a'^r_k(\vec{u}_r, \pi^r)[a'^e_k(\vec{u}_e, \pi^e)]^{-1}$ giving the components of $a'^\mu$.

At step 170, the $4N^2-N^\mu$ lines to which the measurement does not relate are eliminated from $V'^s$ in order to obtain $V'^\mu$.

The vector $a'^\mu$ is projected at 180 onto the space $E'^s$, in order to obtain the near-field modal components, that is to say $\lambda'^\mu=(V'^\mu)^\dagger a'^\mu$.

Next at 190 the operator F is used in order to pass from the modal components of the near-field measurement to the far-field modal components, that is to say $\lambda^\mu=F(\lambda'^\mu)$.

Next, at 193, the reconstructed vector $\tilde{a}=V^s\lambda^\mu$ is calculated.

At 195, the complete bistatic RCS $\tilde{\Sigma}$ is obtained from $\tilde{a}$: $\tilde{\sigma}^{\pi_e \pi_r}_{ij}=|\tilde{a}^{\pi_e \pi_r}_{ij}|^2$. Also only some of the elements of the matrix need to be calculated, for example those giving the monostatic RCS, or even only one for a pair of directions and a pair of polarisations required.

The estimation method advantageously but not necessarily comprises a step of reconditioning of the matrix $V'^\mu$. This matrix reconditioning step is detailed in FIGS. 2 to 4.

Figure 2:
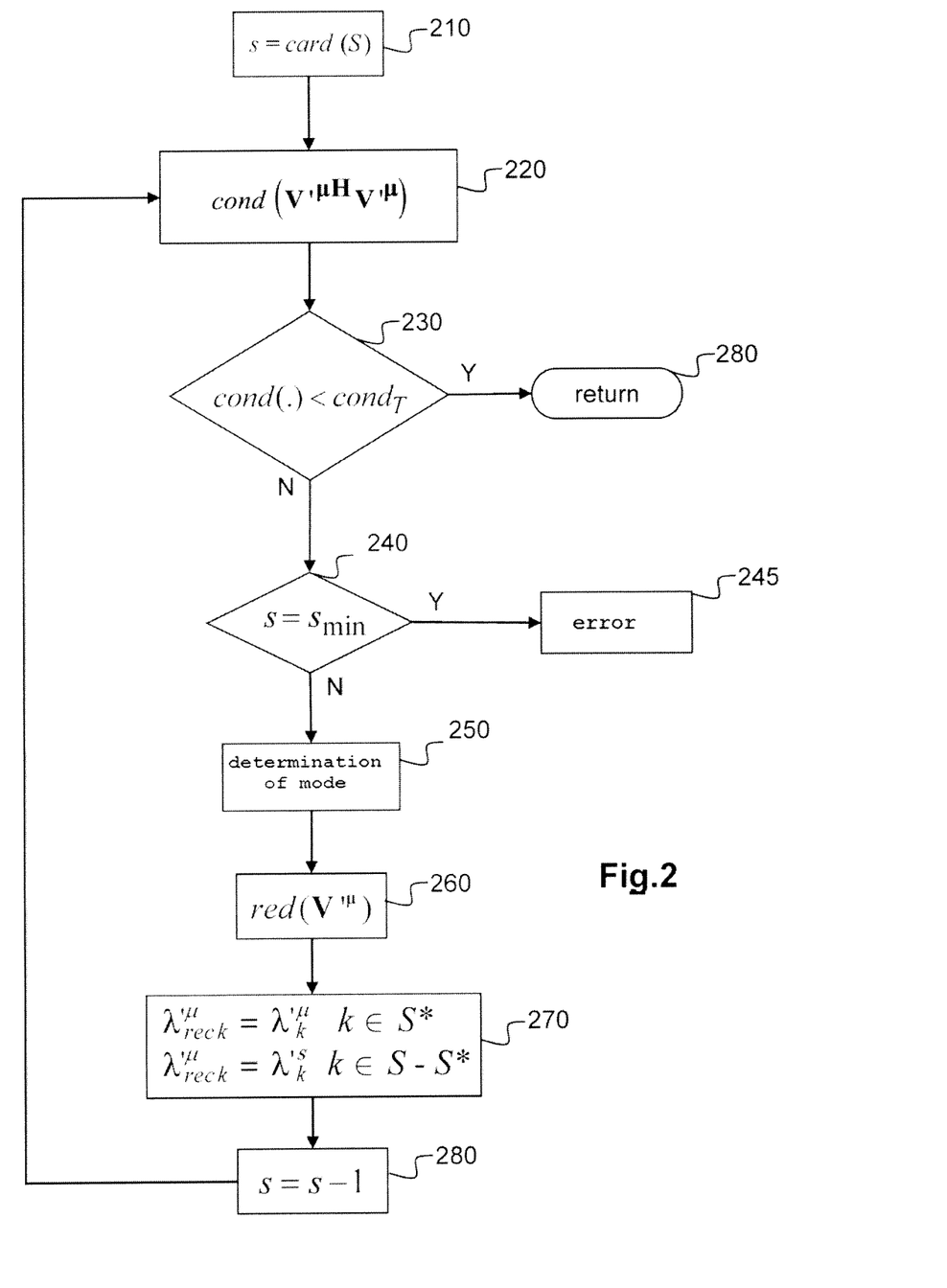
FIGS. 2 to 4 show schematically variants of the matrix reconditioning method, useful for certain embodiments of the invention.

FIG. 2 shows a first variant thereof.

At step 210, the mode counter s is initialised to card(S).

At step 220, the conditioning number of the matrix $V'^{\mu H} V'^\mu$ is calculated and then at 230 it is tested whether this number is less than a threshold value $\text{cond}_T$. In the affirmative, 280 is the exit.

On the other hand, in the negative, at 240 it is tested whether s is equal to the minimum number of modes calculated, $s_{min}$.

If such is the case, one terminates by returning an error message at 245. In the contrary case, the least significant mode, that is to say the component k of $\lambda'^s$ with the lowest modulus, is determined at 250.

At 260, the $k^{th}$ column factor corresponding to this component is eliminated from $V'^\mu$.

At 270, the $k^{th}$ component is replaced in the vector $\lambda'^\mu$ by that of $\lambda'^s$, s is decremented at 280 and then step 220 is returned to.

Figure 3:
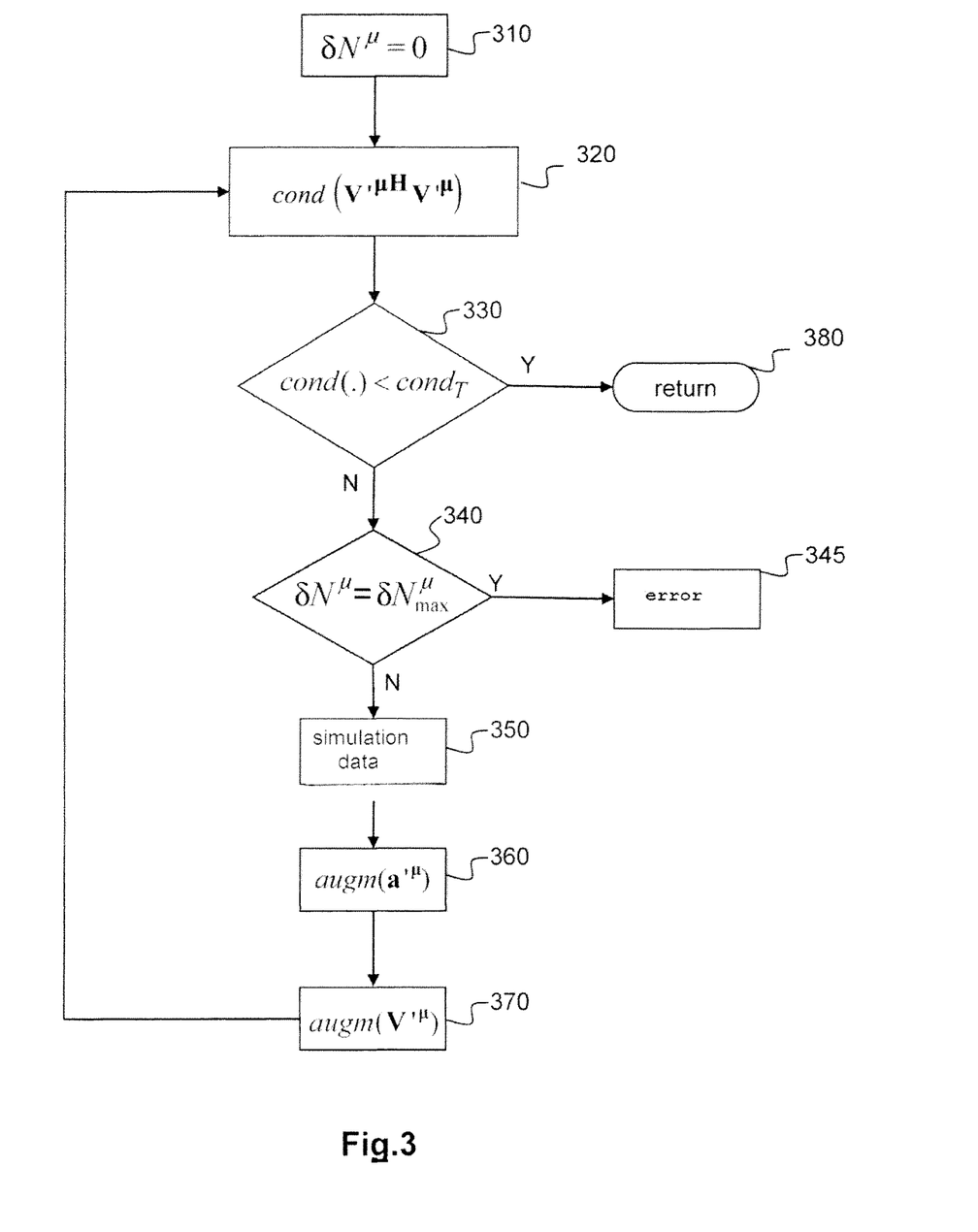

At FIG. 3 a second variant of the matrix reconditioning method is shown.

At step 310, the simulation data counter $\delta N^\mu$ is initialised to zero.

At step 320, the conditioning number of the matrix $V'^{\mu H} V'^\mu$ is calculated and then at 330 it is tested whether this number is less than a threshold value $\text{cond}_T$. In the affirmative, 380 is the exit.

On the other hand, in the negative, at 340 it is tested whether $\delta N^\mu$ is equal to the maximum number of simulation data $\delta N_{max}^\mu$.

If such is the case, one terminates by returning an error message at 345. In the contrary case, an available simulation data item is chosen at 350.

At 360, a supplementary component equal to the simulation data is added to $a'^\mu$ and then $V'^\mu$ is recalculated at 370.

Next step 320 is returned to for the calculation of the new conditioning number.

It will be understood that the choice of the simulation data may be made according to the conditioning gain obtained. It will also be understood, as already set out above, that a matrix reconditioning according to the second variant may follow a matrix reconditioning according to the first variant. Alternatively, recourse will be had in turn to one and the other.

Figure 4:
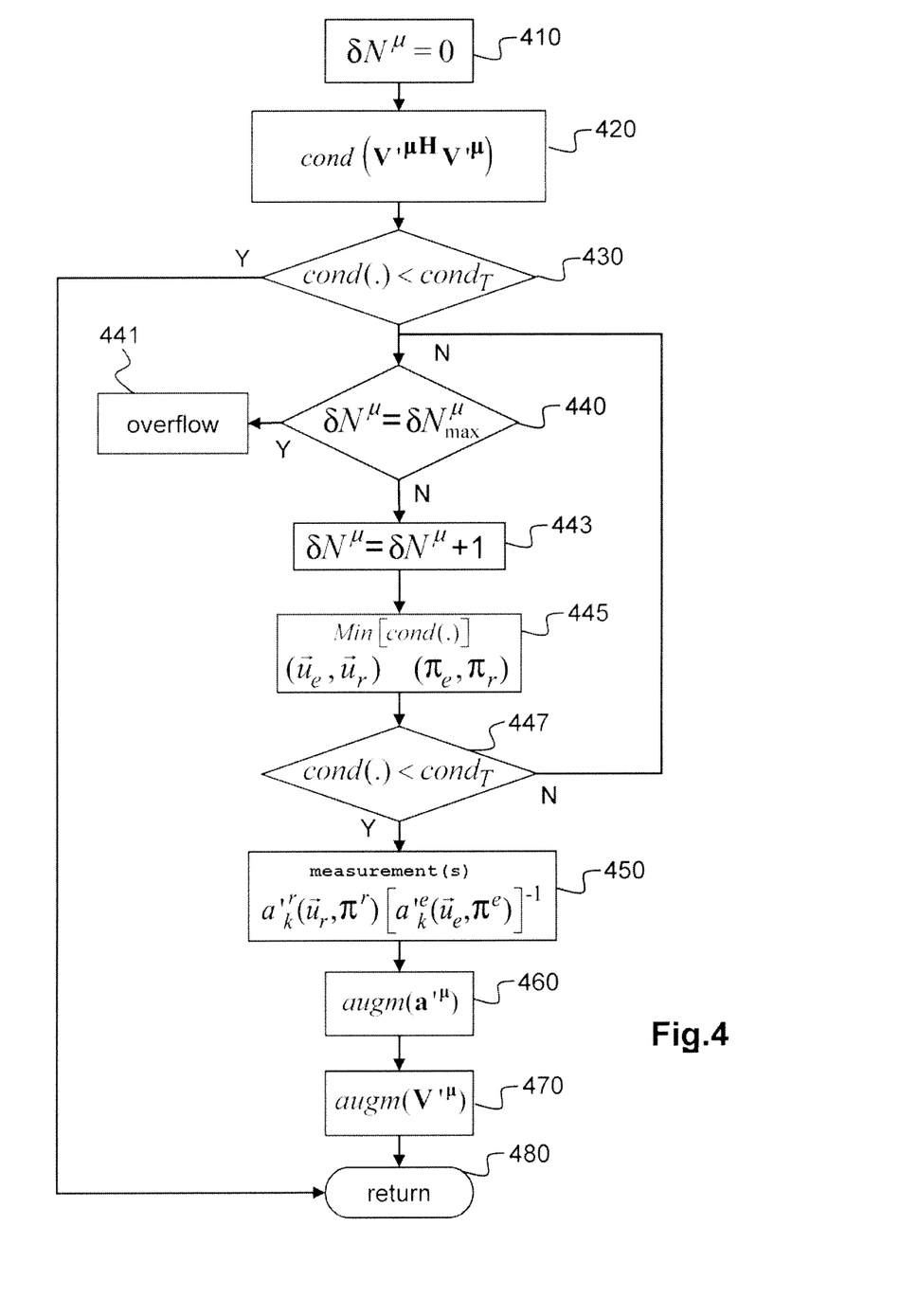

FIG. 4 shows a third variant of the matrix reconditioning method.

At step 410, the additional measurement counter $\delta N^\mu$ is initialised to zero.

At step 420, the conditioning number of the matrix $V'^{\mu H} V'^\mu$ is calculated and then at 430 it is tested whether this number is less than a threshold value $\text{cond}_T$. If so, 480 is the exit.

On the other hand, if not, it is tested whether a maximum number of additional measurements $\delta N_{max}^\mu$ has been reached. If such is the case an overflow message is returned at 441.

If not, $N^\mu$ and $\delta N^\mu$ are incremented at 443. At 445 from $V'^s$ among the $4N^2-N^\mu$ combinations of directions ($\vec{u}_e, \vec{u}_r$) and polarisations ($\pi_e, \pi_r$) possible, the one that is able to minimise the conditioning number is determined.

Steps 443 and 445 are repeated as long as the conditioning number is higher than the threshold value $\text{cond}_T$, as tested at 447.

At 450 the additional measurement or measurements are made as aforementioned and the complex ratio or ratios $a'^r_k(\vec{u}_r, \pi^r)[a'^e_k(\vec{u}_e, \pi^e)]^{-1}$ are calculated.

At 450 the supplementary component or components equal to this or these complex ratios is or are added to $a'^\mu$ and, at 460 the corresponding row or rows to $V'^\mu$. The matrix reconditioning method ends at 480.

The invention claimed is:

1. Method for estimating the equivalent radar cross section of an object on the basis of a first far-field diffraction model of said object and a second near-field diffraction model of said object, the first and second models being able to be respectively represented by a first matrix ($A_b$) and a second matrix ($A'_b$) of complex diffracted wave and incident wave amplitude ratios, for a plurality ($4N^2$) of pairs of respective directions and polarisations of the incident wave and observation of the diffracted wave, said method comprising:

carrying out a modal decomposition of said first and second matrices and selecting the most significant modal vectors (V, V') of the first and second matrices thus decomposed in order to obtain a first base and a second base of modal vectors;

establishing a correspondence between modal vectors of the first base and modal vectors of the second base;

determining an operator (F) for passing from second modal values ($\lambda'^s$) associated with the modal vectors of the second base to first modal values ($\lambda^s$) associated with the modal vectors corresponding to the first base;

making a plurality ($N^\mu$) of measurements of complex diffracted wave and incident wave amplitude ratios in near field for a plurality of pairs of directions and at least one pair of respective polarisations of the incident wave and observation of the diffracted wave;

projecting the vector ($a'^\mu$), formed by the ratios thus measured, onto said modal vectors of the second base, in order to obtain second modal components ($\lambda'^\mu$) on this base;

obtaining first modal components ($\lambda^\mu$) on the first base by applying said operator to the second modal components;

generating from the first modal components and the modal vectors of the first base a reconstructed vector ($\tilde{a}$), the components of which represent the complex incident wave and diffracted wave amplitude ratios for said plurality of pairs of directions and polarisations;

determining the equivalent radar cross section from at least one component of the reconstructed vector.

2. Estimation method according to claim 1, characterised in that said modal decomposition is a diagonalisation and that:

the modal vectors of the first base and the first modal values are respectively the eigenvectors and the eigenvalues of the first matrix;

the modal vectors of the second base and the second modal values are respectively the eigenvectors and the eigenvalues of the second matrix.

3. Estimation method according to claim 1, characterised in that said modal decomposition is a decomposition into singular values and that:

the modal vectors of the first base and the first modal values are respectively the singular vectors and singular values of the first matrix;

the modal vectors of the second base and the second modal values are respectively the singular vectors and the singular values of the second matrix.

4. Estimation method according to claim 1, characterised in that the step of establishing a correspondence comprises seeking, for each modal vector of the second base, the modal vector of the first base that is closest thereto.

5. Estimation method according to claim 1, characterised in that the step of establishing a correspondence comprises establishing a step by step correspondence between the modal vectors of the first base and the modal vectors of the second base by means of a plurality of successive operations, each association relating to an intermediate modal vector base.

6. Estimation method according to claim 1, characterised in that said operator is defined by $F=\mathrm{Diag}(\lambda_s/\lambda'_s)$ where $\lambda_s$, $\lambda'_s$ are respectively the first and second modal values and $\mathrm{Diag}(\cdot)$ is the diagonal matrix of rank s, equal to the number of modal vectors of the first/second base.

7. Estimation method according to claim 1, characterised in that said operator is defined by a pseudo-inverse matrix minimising the distance between $F(\lambda'^s)$ and $\lambda^s$ for a set of pairs $\lambda_p'^s$, $\lambda_p^s$, p=1, ..., P, where $\lambda_p^s$ and $\lambda_p'^s$ are first and second modal values obtained by P respective simulations of the first and second diffraction models.

8. Estimation method according to claim 1, characterised in that $$\lambda'^\mu = (V'^\mu)^\dagger a'^\mu$$

where $\lambda'^\mu$ represents the vector of the second modal components, $(V'^\mu)^\dagger$ is the pseudo-inverse matrix of $V'^\mu$, $V'^\mu$ is the matrix the columns of which are said modal vectors of the second base and the rows of which correspond to the second plurality of measured ratios.

9. Estimation method according to claim 8, characterised by generating the reconstructed vector, $\tilde{a}$, by:

$$\tilde{a} = V^s \lambda^\mu$$

where $V^s$ is the matrix the columns of which are said modal vectors of the first base and the rows of which correspond to the first plurality of ratios of the first model.

10. Estimation method according to claim 9, characterised by obtaining the equivalent radar cross section ($\tilde{\sigma}_{ij}^{\pi_e\pi_r}$) for a pair of incident wave and diffracted wave observation directions and a pair of associated polarisations from the squared modulus ($|\tilde{a}_{ij}^{\pi_e\pi_r}|^2$) of a component of said reconstructed vector.

11. Estimation method according to claim 8, characterised by obtaining the pseudo inverse matrix of $V'^\mu$ by $(V'^\mu)^\dagger = (V'^{\mu H} V'^\mu)^{-1} V'^{\mu H}$, the matrix $V'^\mu$ previously being the subject of a matrix reconditioning if the conditioning number of the matrix $V'^{\mu H} V'^\mu$ is greater than a predetermined threshold ($\mathrm{cond}_T$).

12. Non-transitory computer readable medium storing computer executable instructions which, when executed by a computer, perform an estimation of the equivalent radar cross section of an object on the basis of a first far-field diffraction model of said object and a second near-field diffraction model of said object, the first and second models being able to be respectively represented by a first matrix ($A_b$) and a second matrix ($A'_b$) of complex diffracted wave and incident wave amplitude ratios, for a plurality ($4N^2$) of pairs of respective directions and polarisations of the incident wave and observation of the diffracted wave, by:

carrying out a modal decomposition of said first and second matrices and selecting the most significant modal vectors (V, V') of the first and second matrices thus decomposed in order to obtain a first base and a second base of modal vectors;

establishing a correspondence between modal vectors of the first base and modal vectors of the second base;

determining an operator (F) for passing from second modal values ($\lambda'^s$) associated with the modal vectors of the second base to first modal values ($\lambda^s$) associated with the modal vectors corresponding to the first base;

making a plurality ($N^\mu$) of measurements of complex diffracted wave and incident wave amplitude ratios in near field for a plurality of pairs of directions and at least one pair of respective polarisations of the incident wave and observation of the diffracted wave;

projecting the vector ($a^{IH}$), formed by the ratios thus measured, onto said modal vectors of the second base, in order to obtain second modal components ($\lambda_J^{IH}$) on this base;

obtaining first modal components ($\lambda_J^{H}$) on the first base by applying said operator to the second modal components;

generating from the first modal components and the modal vectors of the first base a reconstructed vector (ã), the components of which represent the complex incident wave and diffracted wave amplitude ratios for said plurality of pairs of directions and polarisations;

determining the equivalent radar cross section from at least one component of the reconstructed vector.

\* \* \* \* \*